US012425032B1

(12) United States Patent
Lenka et al.

(10) Patent No.: US 12,425,032 B1
(45) Date of Patent: Sep. 23, 2025

(54) RING VOLTAGE CONTROLLED OSCILLATOR-BASED PHASE LOCKED LOOP WITH DUAL CHARGE PUMP ARCHITECTURE

(71) Applicant: Cadence Design Systems, Inc., San Jose, CA (US)

(72) Inventors: Prakash Kumar Lenka, Orissa (IN);
Sumit Gupta, Madhya Pradesh (IN);
Vinod Kumar, Uttar Pradesh (IN);
Jitendra Kumar Yadav, Bhopal (IN);
Virvasav Sinha, Bengaluru (IN);
Rajashekhar Krishnamurthy Rao,
Bangalore (IN)

(73) Assignee: Cadence Design Systems Inc., San Jose, CA (US)

( * ) Notice: Subject to any disclaimer, the term of this patent is extended or adjusted under 35 U.S.C. 154(b) by 106 days.

(21) Appl. No.: 18/475,676

(22) Filed: Sep. 27, 2023

(51) Int. Cl.
*H03L 7/099* (2006.01)
*H03L 7/089* (2006.01)

(52) U.S. Cl.
CPC .......... *H03L 7/0995* (2013.01); *H03L 7/0891* (2013.01)

(58) Field of Classification Search
CPC . H03L 7/093; H03L 7/085; H03L 7/08; H03L 7/06
See application file for complete search history.

(56) References Cited

U.S. PATENT DOCUMENTS 9,178,551 B2 * 11/2015 Vigraham ................ H04B 1/69
10,361,706 B2 * 7/2019 Chattopadhyay ..... H04L 7/0008
10,389,368 B1 * 8/2019 Wang ..................... H03L 7/089

* cited by examiner

*Primary Examiner* — Diana J. Cheng
(74) *Attorney, Agent, or Firm* — Mark H. Whittenberger; Holland & Knight LLP

(57) ABSTRACT

Embodiments included herein are directed towards a ring voltage-controlled oscillator based phase locked loop circuit. Embodiments may include an integral path including a plurality of resistors and a plurality of transistors configured to correct low frequency variations and a proportional path in electrical communication with the integral path, the proportional path including a plurality of transistors and a source degeneration circuit. Embodiments may further include a decoupling capacitor located at a ring voltage-controlled oscillator node in electrical communication with the proportional path, wherein the source degeneration circuit operates to cancel any effect from the ring voltage-controlled oscillator node.

18 Claims, 12 Drawing Sheets

1200 providing an integral path including a plurality of resistors and a plurality of transistors configured to correct low frequency variations and a proportional path in electrical communication with the integral path, the proportional path including a plurality of transistors and a source degeneration circuit

1202

electrically connecting a decoupling capacitor located at a ring voltage controlled oscillator node with the proportional path, wherein the source degeneration circuit operates to cancel any effect from the ring voltage controlled oscillator node

RING VOLTAGE CONTROLLED OSCILLATOR-BASED PHASE LOCKED LOOP WITH DUAL CHARGE PUMP ARCHITECTURE

BACKGROUND

A frequency synthesizer is an apparatus that generates an output signal having a frequency that is an exact multiple of a reference frequency. The accuracy of the output signal frequency is typically determined by the accuracy and stability of the reference frequency source.

A common type of frequency synthesizer uses a phase-locked loop (PLL) to provide an output signal having a selectable, precise and stable frequency. The PLL includes a phase detector, a voltage-controlled oscillator (VCO) and a feedback path arranged in a way that the phase of the VCO output is forced to be synchronous with the phase of the input reference frequency.

SUMMARY

In one or more embodiments of the present disclosure, a ring voltage-controlled oscillator based phase locked loop circuit is provided. Embodiments may include an integral path including a plurality of resistors and a plurality of transistors configured to correct low frequency variations and a proportional path in electrical communication with the integral path, the proportional path including a plurality of transistors and a source degeneration circuit. Embodiments may further include a decoupling capacitor located at a ring voltage-controlled oscillator node in electrical communication with the proportional path, wherein the source degeneration circuit operates to cancel any effect from the ring voltage-controlled oscillator node.

One or more of the following features may be included. In some embodiments, the proportional path may further include a second source degeneration circuit. The circuit may further include first charge pump circuitry associated with the integral path and/or second charge pump circuitry associated with the proportional path. The source degeneration circuit may include a programmable resistor. The source degeneration circuit may include a MOSFET. The source degeneration circuit may include a capacitor.

In one or more embodiments of the present disclosure a method including a ring voltage-controlled oscillator based phase locked loop is provided. The method may include providing an integral path including a plurality of resistors and a plurality of transistors configured to correct low frequency variations and a proportional path in electrical communication with the integral path. The proportional path may include a plurality of transistors and a source degeneration circuit. The method may further include electrically connecting a decoupling capacitor located at a ring voltage-controlled oscillator node with the proportional path, wherein the source degeneration circuit operates to cancel any effect from the ring voltage-controlled oscillator node.

One or more of the following features may be included. In some embodiments, the proportional path may further include a second source degeneration circuit. The method may further include providing first charge pump circuitry associated with the integral path and/or second charge pump circuitry associated with the proportional path. The source degeneration circuit may include a programmable resistor and/or a MOSFET. The source degeneration circuit may further include a capacitor.

In one or more embodiments of the present disclosure, a ring voltage-controlled oscillator based phase locked loop circuit is provided. The circuit may include an integral path including a first resistor directly connected with a first transistor and a second resistor directly connected with a second transistor. The circuit may also include a proportional path in electrical communication with the integral path, the proportional path including a first source degeneration circuit directly connected with a first transistor and a second source degeneration circuit directly connected with a second transistor. The circuit may further include a decoupling capacitor located at a ring voltage-controlled oscillator node in electrical communication with the proportional path, wherein the source degeneration circuit operates to cancel any effect from the ring voltage-controlled oscillator node.

One or more of the following features may be included. In some embodiments, the circuit may include first charge pump circuitry associated with the integral path and/or second charge pump circuitry associated with the proportional path. The source degeneration circuit may include a programmable resistor, a MOSFET, and/or a capacitor.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

FIG. 12 shows an exemplary flowchart according to embodiments of the present disclosure.

DETAILED DESCRIPTION

Embodiments of the present disclosure are directed towards a ring VCO-based PLL having a dual charge pump architecture. Embodiments included herein provide low supply induced jitter and have a high loop bandwidth as is discussed in further detail hereinbelow.

In a graphics data double data rate ("GDDR") architecture a high-performance clock synthesizer (typically a ring VCO based PLL) may be employed due to its wide tuning range and less area. However, in some ring VCO based PLLs, there is a strong trade-off between jitter (RJ and DJ) reduction and PLL loop stability. Embodiments of the present disclosure provide a new approach for obtaining a low jitter PLL clock to address the jitter (RJ and DJ) reduction and high loop stability issues.

Figure 1:
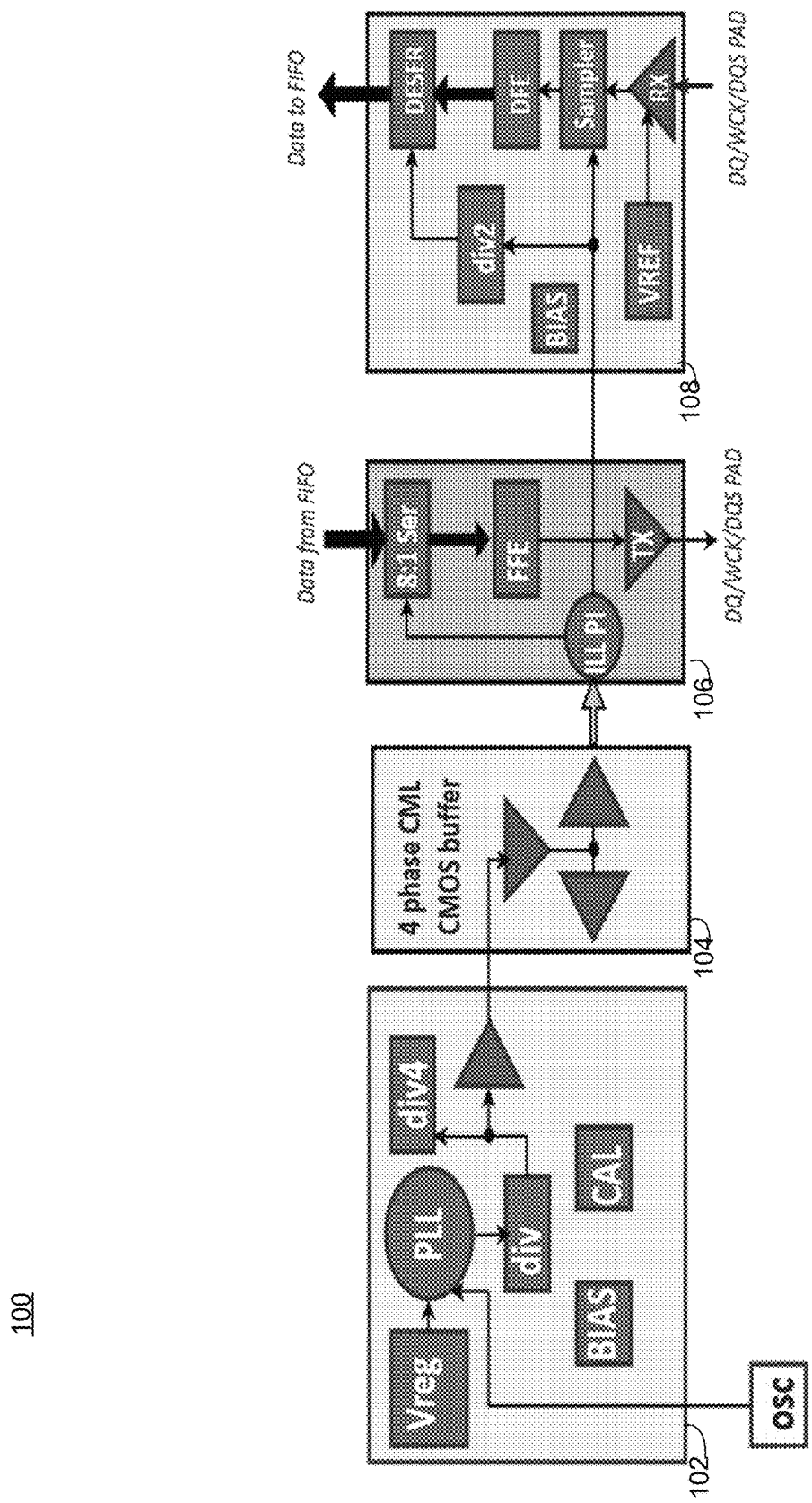
FIG. 1 is an example block diagram of a phase locked loop architecture consistent with embodiments of the present disclosure.

Referring now to FIG. 1, an example block diagram of phase locked loop circuitry 100 consistent with embodiments of the present disclosure is provided. PLL circuitry 100 may include transmitter and receiver circuitry as is discussed below. Initial circuitry 102 may include a voltage regulator ("Vreg") may be in electrical communication with phase locked loop (PLL) circuitry. PLL circuitry may provide an output to clock divider circuitry. Bias and calibration circuits may be employed as is known in the art. In this particular example, the output from the initial block may be received at a 4-phase current mode logic ("CML") complementary metal oxide semiconductor ("CMOS") buffer circuitry 104. Buffer circuitry 104 may generate an output that may be received at injection locked loop ("ILL") and phase interpolator ("PI") circuitry 106, which may provide an output to 8:1 serializer circuitry. Serializer circuitry may generate an output and provide the output to feed forward equalization circuitry prior to sending the subsequent output to transmitter circuitry. Circuitry 106 may transmit a signal to sampler and digital feedback equalization circuitry 108. In operation, a reference voltage ("Vref") may be provided to receiver ("RX") circuitry before being sent to sampler circuitry, DFE circuitry, and deserializer ("DESER") before data is sent to the FIFO.

Figure 2:
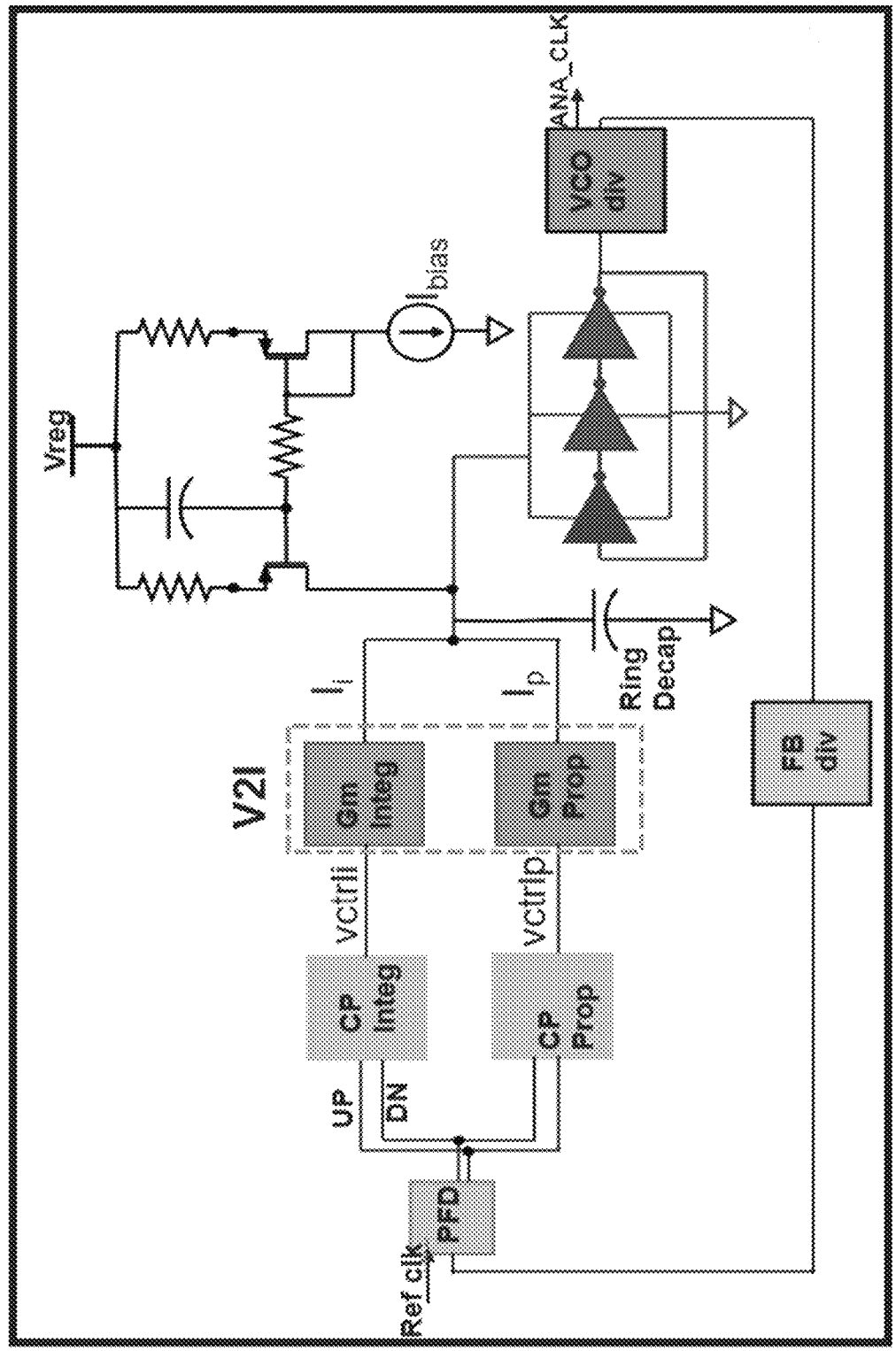
FIG. 2 is an example block diagram of a phase locked loop Ring voltage-controlled oscillator consistent with embodiments of the present disclosure.

Referring now to FIG. 2, an example block diagram of a phase locked loop ring voltage-controlled oscillator circuitry 200 is provided. Oscillator circuitry 200 may include phase frequency detection circuitry configured to receive a reference clock signal. Phase frequency detection circuitry may generate an output, which may be provided to integral charge pump circuitry ("CP integ") and proportional charge pump circuitry ("CP prop"), which combined are included within voltage to current converter circuitry ("V2I"). Integral charge pump circuitry may generate integral control voltage ("VCTRLI") and transmit it to an integral transconductance stage ("GM integ") while proportional charge pump circuitry similarly generates a proportional control voltage ("VCTRLP") to proportional transconductance stage ("GM prop"). Circuitry 200 may further include voltage-controlled oscillator circuitry and feedback divider circuitry, which provides feedback to phase frequency detection circuitry.

The low jitter (DJ and RJ) PLL clock issue discussed above may have significant ramifications. The PLL may be one or the most important blocks as it provides the clock to various components in a GDDR architecture (e.g., transmitter, receiver, delay line, serializer, de-serializer, ILL, clock tree, etc. The performance of the above blocks is strongly dependent on the purity of the PLL output clock. As such, any small fluctuations in the PLL clock may lead to significant performance degradation of the above blocks which, in turn, may lower the performance of the overall GDDR architecture. A PLL having a poor-quality clock forces the receiver and transmitter to sample erroneous data leading to a complete failure of timing margin requirements.

Figure 3:
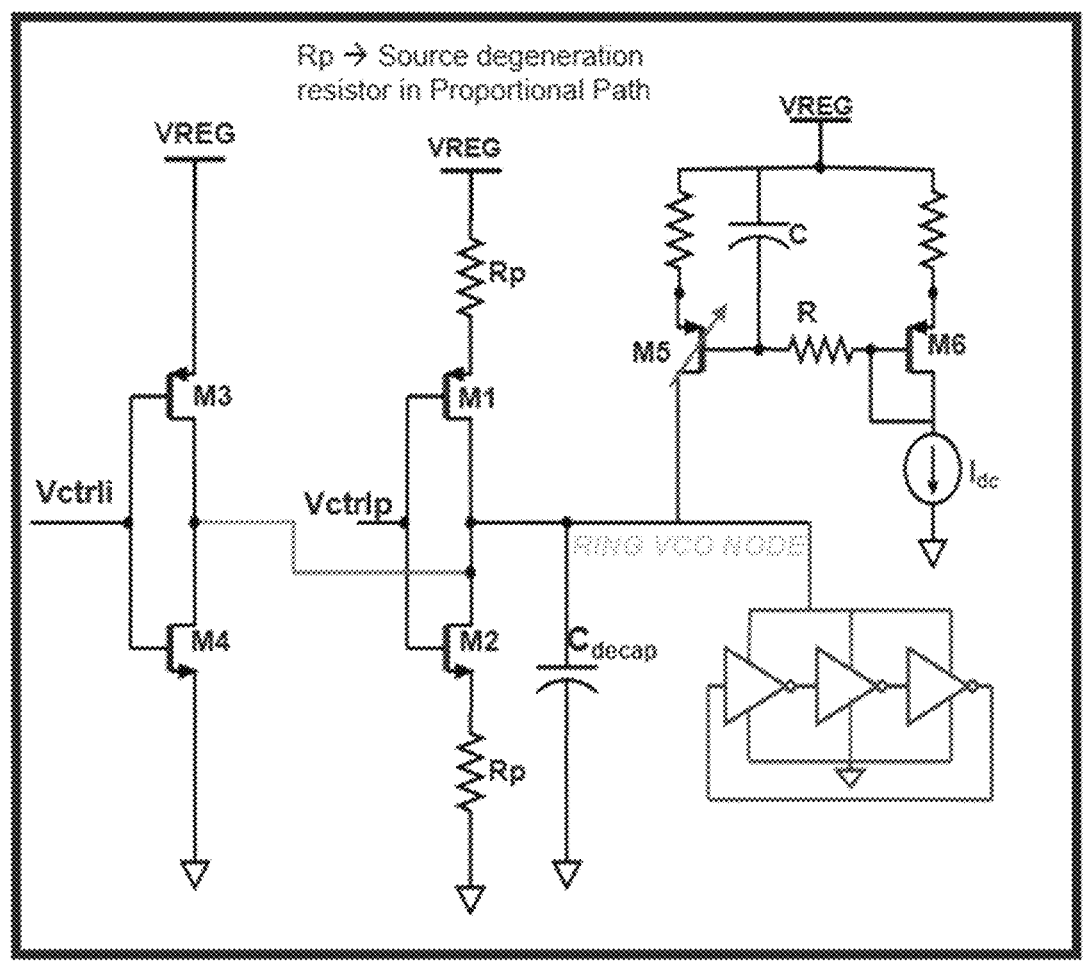
FIG. 3 is an example of a conventional Ring VCO based PLL consistent with embodiments of the present disclosure.
Figure 4:
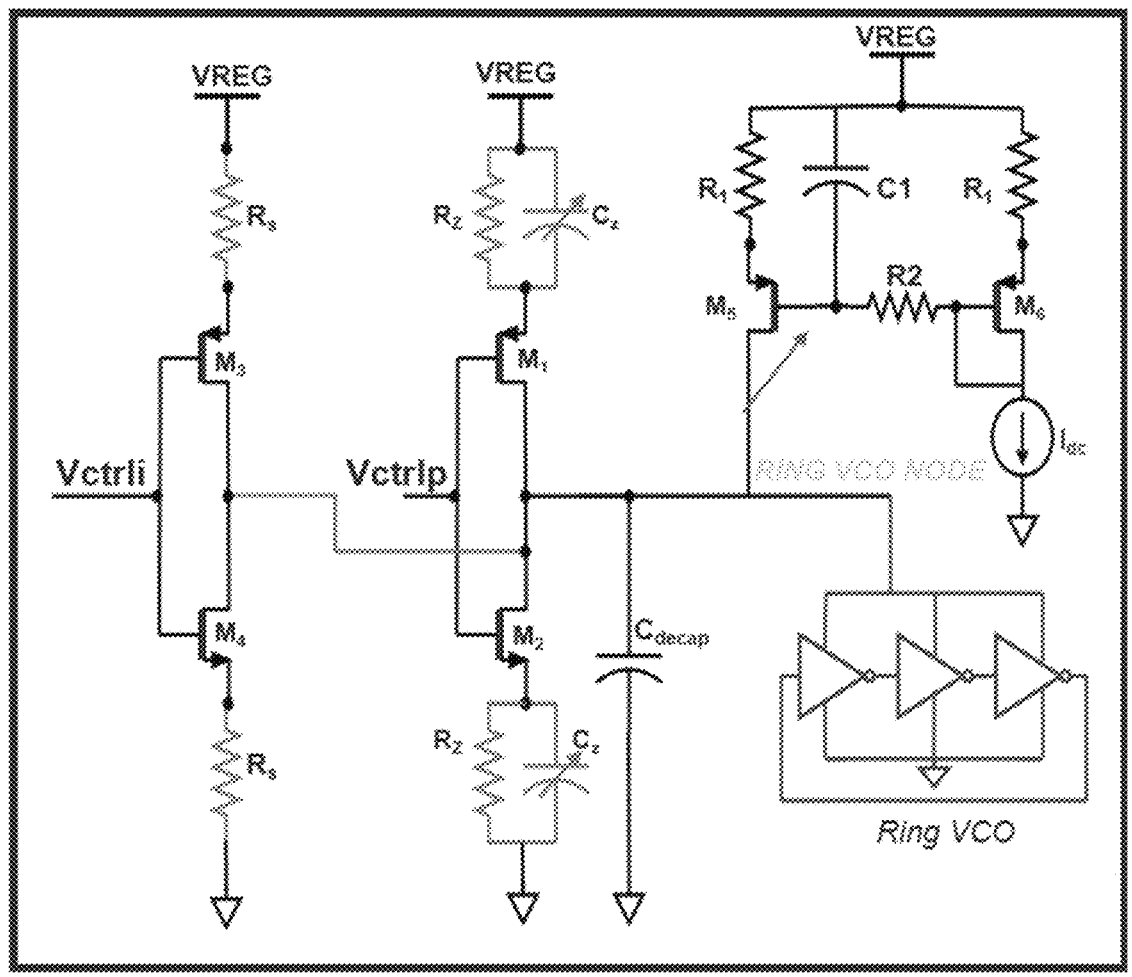
FIG. 4 is an example Ring VCO based PLL consistent with embodiments of the present disclosure.

Referring now to FIG. 3, an example of a conventional ring VCO based PLL circuit 300 is provided. As shown in FIG. 3, the conventional ring VCO based PLL may include a dual path architecture having both a proportional and integral path. The proportional path is mainly responsible for the correction of high frequency variations in the PLL loop and the integral path for low frequency variations in the PLL loop. The ring VCO may be used for generating the high frequency output clock and the PLL loop may be configured to sense the ring VCO output and synthesize the stable high frequency clock using a loop correction method. However, the unity gain bandwidth (UGB) of the PLL loop for this conventional architecture is limited due to the ring VCO node pole as this pole directly conflicts with the bandwidth of the PLL loop. Because of the limited bandwidth of the circuit of FIG. 3, the overall phase noise of the loop has less ability to get rectified, which, in turn, increases the random jitter (RJ) of overall PLL loop. The ring VCO node pole, which is conventionally placed far away from UGB of the PLL loop for stability reasons, is not able to suppress the high frequency supply noise variation significantly. This causes deterministic jitter (DJ) of the overall PLL loop to become high. Both types of jitter, the DJ due to the power supply variation and the RJ due to the device phase noise are important performance metrics for a PLL output clock synthesizer. For the ring VCO based PLL to work properly, the PLL loop must be stable enough and have a high loop bandwidth (UGB) to cancel the effect of phase noise produced by the ring VCO, which is inherently the noisiest block inside the PLL loop. The VCO ring node, which is being fed by the V2I block and the bias block as required in a current controlled ring oscillator ("CCO") is extremely sensitive and directly responsible for the overall jitter that comes to the output of the PLL. To minimize the sensitivity of the VCO ring node with respect to high frequency supply noise and higher offset phase noise frequency, it may be necessary to lower the impedance on the ring VCO node thereby demanding a high value decoupling capacitor (C) to be placed on this node. This translates the ring VCO pole(s) to approach the UGB of PLL loop. Because of the movement of the ring VCO pole(s) towards UGB, the stability of the PLL loop is affected adversely. As such, there is a strong trade-off between jitter reduction and loop stability, which is the bottleneck in some ring VCO based PLLs.

Referring now to FIGS. 4-12, embodiments of the present disclosure may address some of the issues identified above by utilizing a new pole zero compensated ring VCO based PLL architecture. This architecture may help in reducing the DJ and RJ without affecting PLL loop stability. Embodiments included herein may work well in a noisy supply environment as it makes the PLL output less sensitive to power supply variations and may reduce the overall phase noise of the PLL output. This pole zero compensated ring VCO based PLL architecture helps in suppressing the phase noise contribution from the ring VCO to the PLL output due to the scope of increasing the UGB of the PLL loop. This proposed architecture guarantees the lowering of the ring VCO node impedance thereby making the ring VCO less sensitive to high frequency supply noise variation, due to lowering the ring VCO impedance the ring pole approaches the UGB, which is being cancelled by the compensated zero added in the proportional V2I path. Hence, embodiments included herein may have the ability to increase the UGB of the PLL without effecting loop stability. Moreover, this pole zero compensated ring VCO based PLL architecture helps in improving the overall jitter of the PLL output clock with no extra power consumed compared to the conventional architecture.

Referring again to FIG. 4, an example ring VCO based PLL circuit 400 consistent with embodiments of the present disclosure is provided. In this example, Rs is the source degeneration resistor in the integral path and Rz and Cz are added components to introduce a zero in the path. The prime intention behind the proposed architecture is to reduce DJ, which is produced mainly due to power supply induced noise and RJ due to flicker and thermal noise produced by the devices used in PLL. This has been achieved by increasing the decoupling capacitor used in the ring VCO top node thereby suppressing the noise generated because of supply noise variation and the random noise owing to various devices used in the PLL. However, increasing the decoupling capacitor used on the ring VCO node may directly conflict with the stability of the overall PLL as the pole created at this ring VCO node comes closer to the UGB of the PLL thereby degrading the phase margin (PM) of the PLL loop. The trade-off between the stability and performance improvement due to the reduction of both DJ and RJ has been successfully broken by the proposed technique providing both better stability and high performance in terms of improved jitter of the ring PLL.

Figure 5:
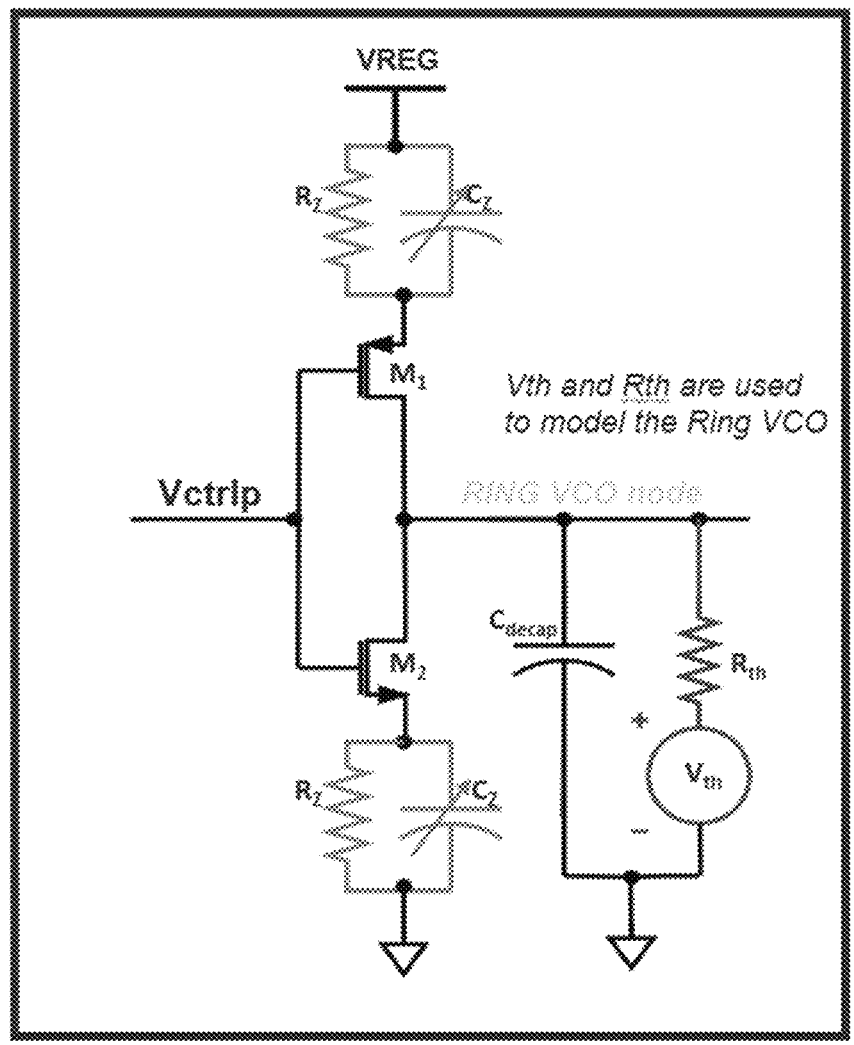
FIG. 5 is an example circuit showing a compensating proportional path consistent with embodiments of the present disclosure.

Referring now to FIG. 5, an example circuit 500 showing a compensating proportional path consistent with embodiments of the present disclosure is provided. In this particular example, a compensating proportional path in the V2I block with a ring VCO Thevenin model is provided. As shown in FIG. 5, the decoupling capacitor at the ring VCO node has been increased nine times compared to the architecture described above so that the pole produced due to the addition of the extra decoupling capacitor directly suppresses the noise induced on the ring VCO node due to power supply noise and random noise variation of the devices. The increased decoupling capacitor assists the pole at the ring VCO node to approach the UGB of the PLL, which directly reduces the overall phase margin of the PLL loop. In some embodiments, the pole at the ring VCO node has been compensated by adding the zero in the proportional V2I path as shown in FIG. 5. This may be achieved by placing the ring pole ($S_{pring}=1/(R_{th}*C_{decap})$) close to the compensating zero ($S_z=1/R_z*C_z$). The creation of the compensating zero may also give rise to extra parasitic pole ($S_{par} \approx g_m/C_z$) In some embodiments, the extra parasitic pole ($S_{par}$) has been shifted much farther from the ring VCO node pole by increasing the overall transconductance ($gm=gm_{M1}+gm_{M2}$) of the 312 proportional V2I block.

Figure 6:
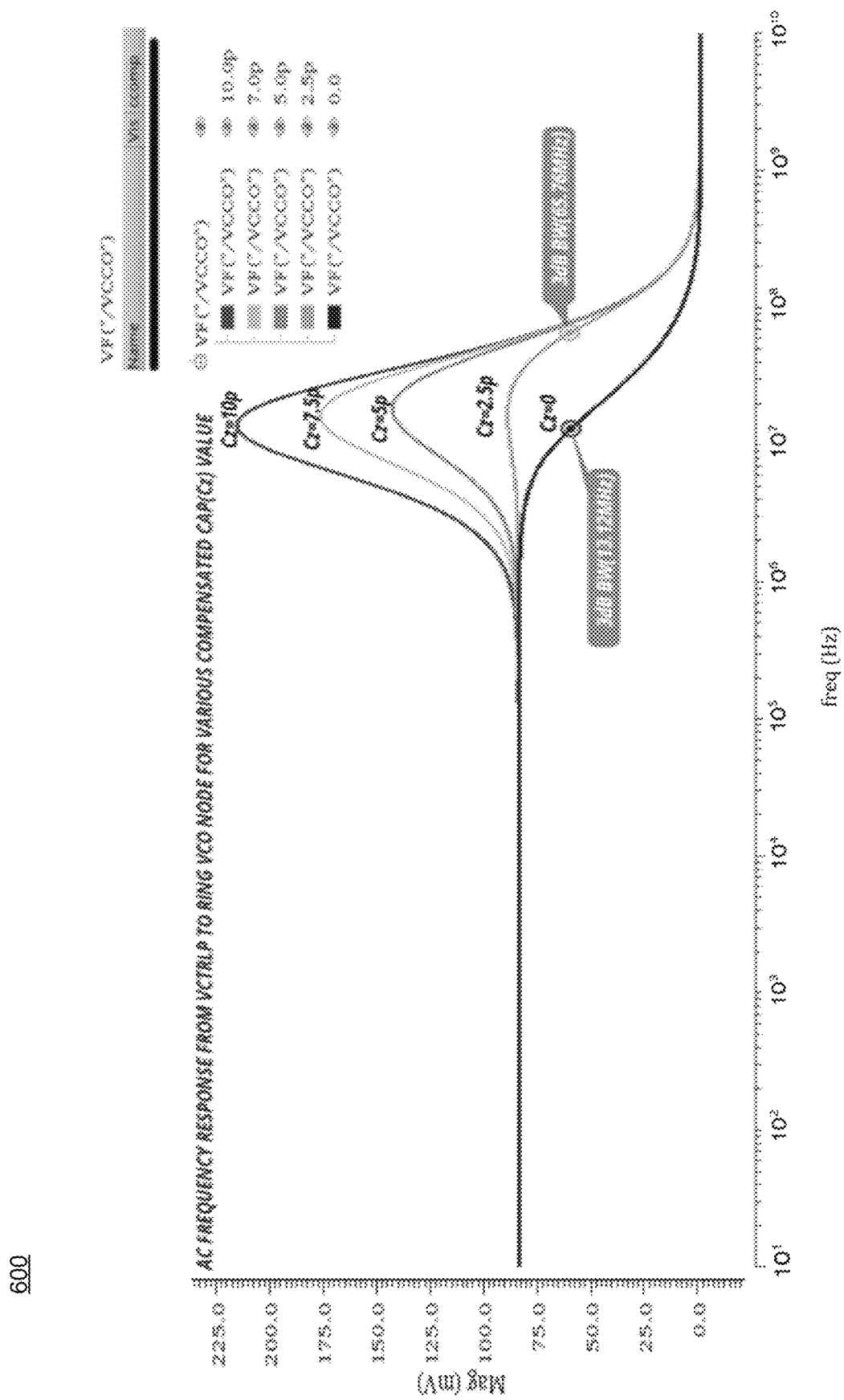
FIG. 6 is an AC frequency response plot consistent with embodiments of the present disclosure.

Referring now to FIG. 6, an AC frequency response plot consistent with embodiments of the present disclosure is provided. Specifically, FIG. 6 shows an AC frequency response from the Vctrlp node to the ring VCO node. By changing the Vctrlp node by $\Delta V_{in}$ and measuring its effect on the ring VCO node (i.e., a small signal AC response from Vctrlp node to the ring VCO node). The increase in the decoupling capacitor ($C_{decap}$) at the ring VCO node leads to a reduction in bandwidth of the AC gain response from the Vctrlp node to the ring VCO node as observed in FIG. 6. The value of $R_z$ and $C_z$ has been selected in such a way that the bandwidth of the AC gain response from the Vctrlp node to the ring VCO node may be restored back to the previous value, where the ring decoupling capacitor is kept to one unit. Also, the placement of the compensating zero has been done in such a way that there will be minimal peaking in the AC gain response from the Vctrlp node to the ring VCO node.

Figure 7:
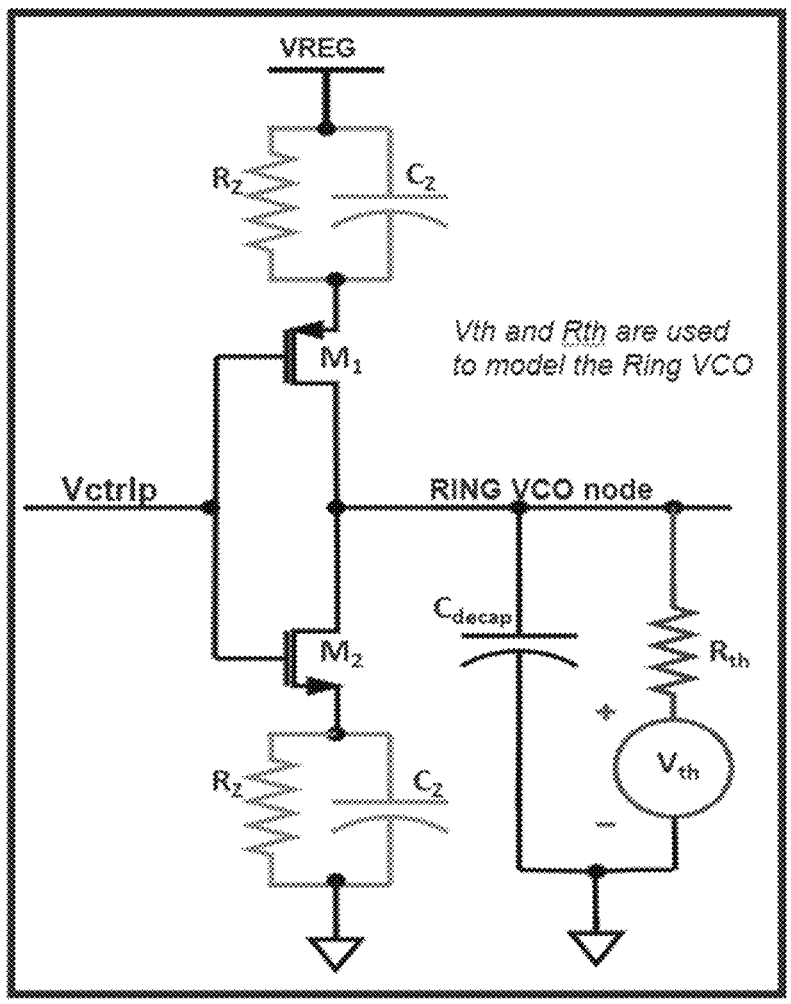
FIG. 7 is an example circuit showing a compensating proportional path consistent with embodiments of the present disclosure.

Referring now to FIG. 7, an example circuit 700 showing a compensating proportional path consistent with embodiments of the present disclosure is provided. More specifically, FIG. 7 shows the compensated proportional V2I block with a Thevenin model of the ring VCO. In some embodiments, circuit 700 may work on the principle of the pole zero compensation method to take advantage of the improved stability of the PLL loop as well as low jitter (RJ+DJ) PLL output clock. As shown in FIG. 7, the ring VCO has been modeled as a Thevenin voltage source ($V_{th}$) and a Thevenin resistance ($R_{th}$) for linear approximation analysis. The location of the pole produced at the ring VCO node due to the extra addition of decoupling capacitor is $S_{pring}=1/(R_{th}*C_{decap})$ because $C_{decap}$ has been increased to a higher value. The movement of the ring VCO node pole ($S_{pring}$) approaches the UGB of the PLL loop leading to degrading stability and lowers the phase margin (PM) of the overall PLL loop. The core principle behind the proposed architecture is that by adding the source degeneration resistor ($R_Z$) and cap ($C_z$) as shown in FIG. 7 in the proportional V2I path, thereby producing the zero frequency ($S_Z=1/R_Z*C_z$) which may be adjusted suitably to cancel the effect of the ring VCO node pole (i.e., $S_{pring}$) so that the pole zero compensation method is being achieved.

Figure 8:
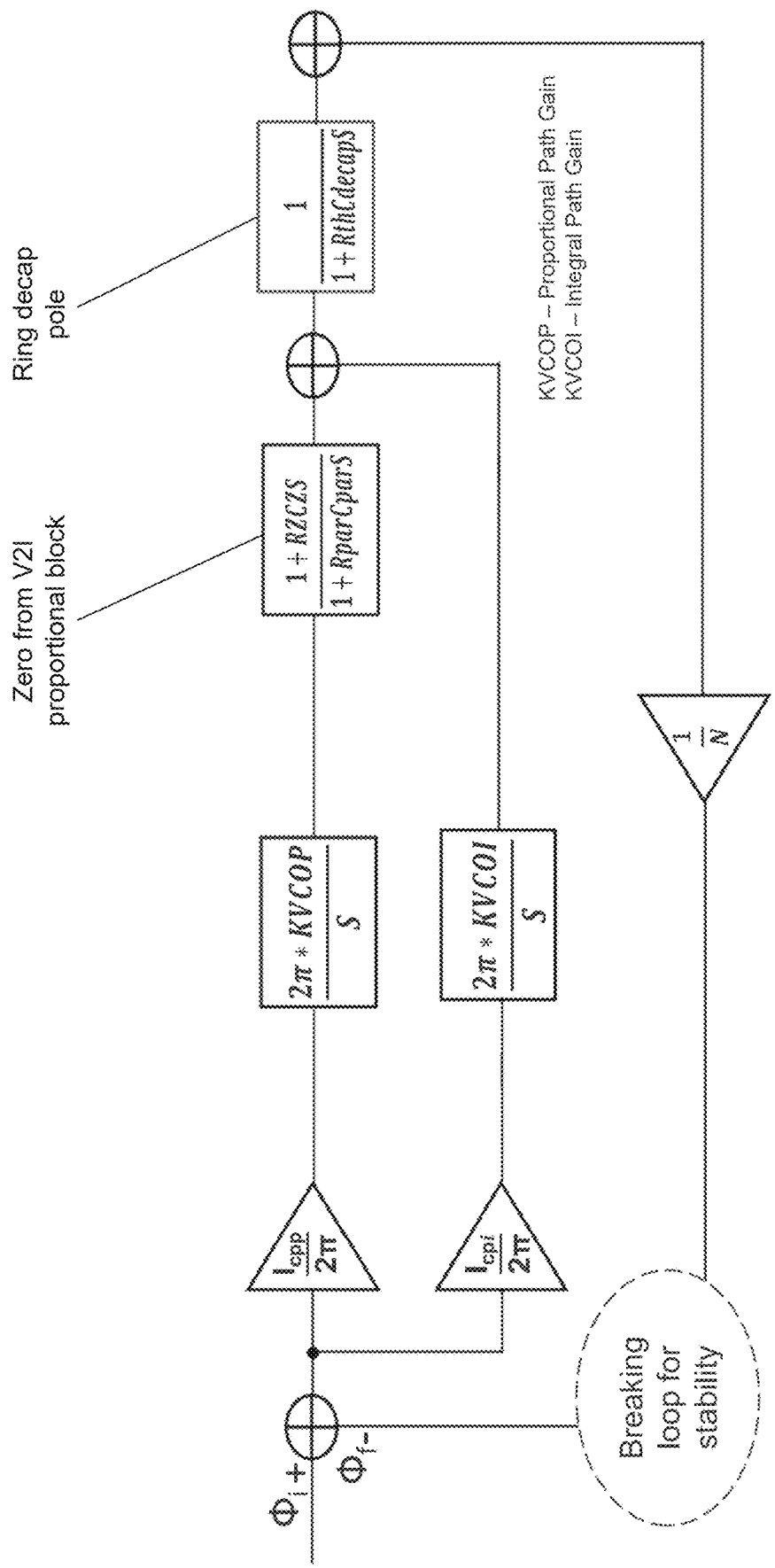
FIG. 8 is an example phase domain model consistent with embodiments of the present disclosure.
Figure 9:
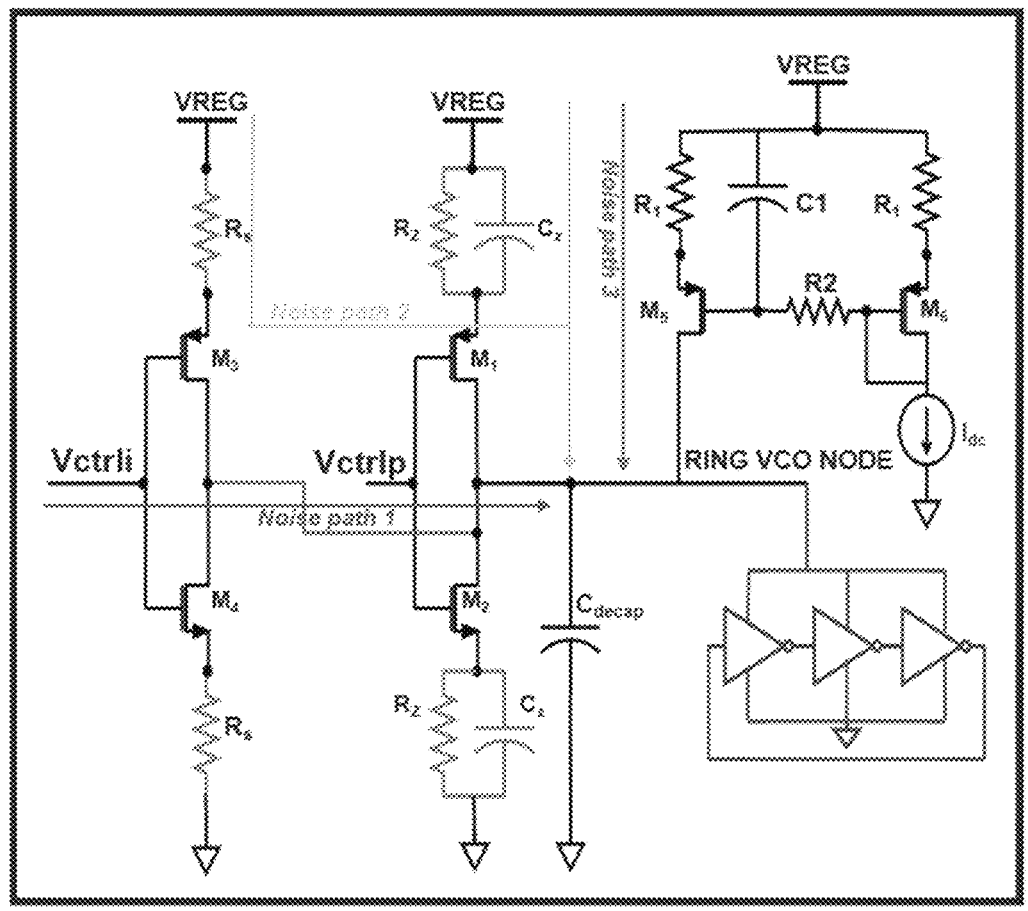
FIG. 9 is an example supply noise flow diagram consistent with embodiments of the present disclosure.

Referring now to FIG. 8, an example phase domain model 800 consistent with embodiments of the present disclosure is provided. More specifically, FIG. 8 shows a phase domain model for a ring VCO based PLL loop. The mechanism by which the proposed architecture helps in improving the loop stability is shown in FIG. 8. The stability effect is being captured by modeling the PLL in a small signal phase domain model as shown in FIG. 8. The ring decoupling capacitor pole has been modeled in the small signal phase domain block as depicted in FIG. 8. This ring pole has been compensated by the creation of a zero from the V2I proportional block as marked in FIG. 8. The creation of a compensating zero also gives rise to an extra parasitic pole ($S_{par}$) as depicted in FIG. 8, the value of $S_{par}=1/R_{par}C_{par}=gm/C_{par}$, gm may be selected such that the parasitic is much farther away from UGB as well as the ring VCO node pole $S_{pring}$.

Based on the small signal phase model of the PLL loop, the phase margin in the open loop and the magnitude peaking in the closed loop has been observed and mentioned below. The overall open loop transfer function of the small signal phase domain model in the open loop may be expressed as indicated below.

Without Compensation:

$$\text{Open loop Transfer Function} = \left[\frac{I_p}{2\pi} \times R \times \frac{2\pi Kp}{S} + \frac{I_i}{2\pi} \times \frac{1}{CS} \times \frac{2\pi Ki}{S}\right]\frac{1}{N} \times \frac{1}{(1+RthCdecap_s)}$$

With Compensation:

$$\text{Open loop Transfer Function} = \left[\frac{I_p}{2\pi} \times R \times \frac{2\pi Kp}{S} \times \frac{(1+S/\omega_z)}{1+S/\omega_p} + \frac{I_i}{2\pi} \times \frac{1}{CS} \times \frac{2\pi Ki}{S}\right]\frac{1}{N} \times \frac{1}{(1+R_{th}C_{decap}S)}$$

$\omega_z = \frac{1}{R_{th}C_{decap}} = \omega_{ring}$; $\omega_p \gg \omega_{ring}$ to keep the PLL loop stable In this example:
$K_p$=proportional gain (Hz/V),
$K_i$=integral gain (Hz/V),
R=resistor in proportional charge pump,
C=capacitor in integral charge pump,
$I_i$=integral charge pump current,
$I_p$=proportional charge pump current,
$R_{th}$=ring Thevenin resistance,
$C_{decap}$=ring VCO node Decap,
N=feedback divider
$w_z$=compensating zero in the proportional V2I block $(1/R_ZC_Z)$,
$w_p$=parasitic pole in the proportional V2I block $g_m/C_z$ Referring now to FIG. 9, an example supply noise flow circuit 900 consistent with embodiments of the present disclosure is provided. As shown in the FIG. 9, in some embodiments, there may be three supply noise paths. A first path (e.g., path 1) from the regulator through V2I block. A second path (e.g., path 2) from the VCTRLI, VCTRLP node through the V2I block through the ring VCO node and a third path (e.g., path 3) from the bias block for the ring CCO. In some embodiments, due to the increment of the decoupling capacitor at the ring VCO node, the contribution of any high frequency variations that come from path1, path2 and path3 through the ring VCO node may be reduced. This may be due to the decrement of impedance Zin as explained below, the supply noise variation has been significantly reduced, which, in turn, lowers the DJ due to power supply variation.

Figure 10:
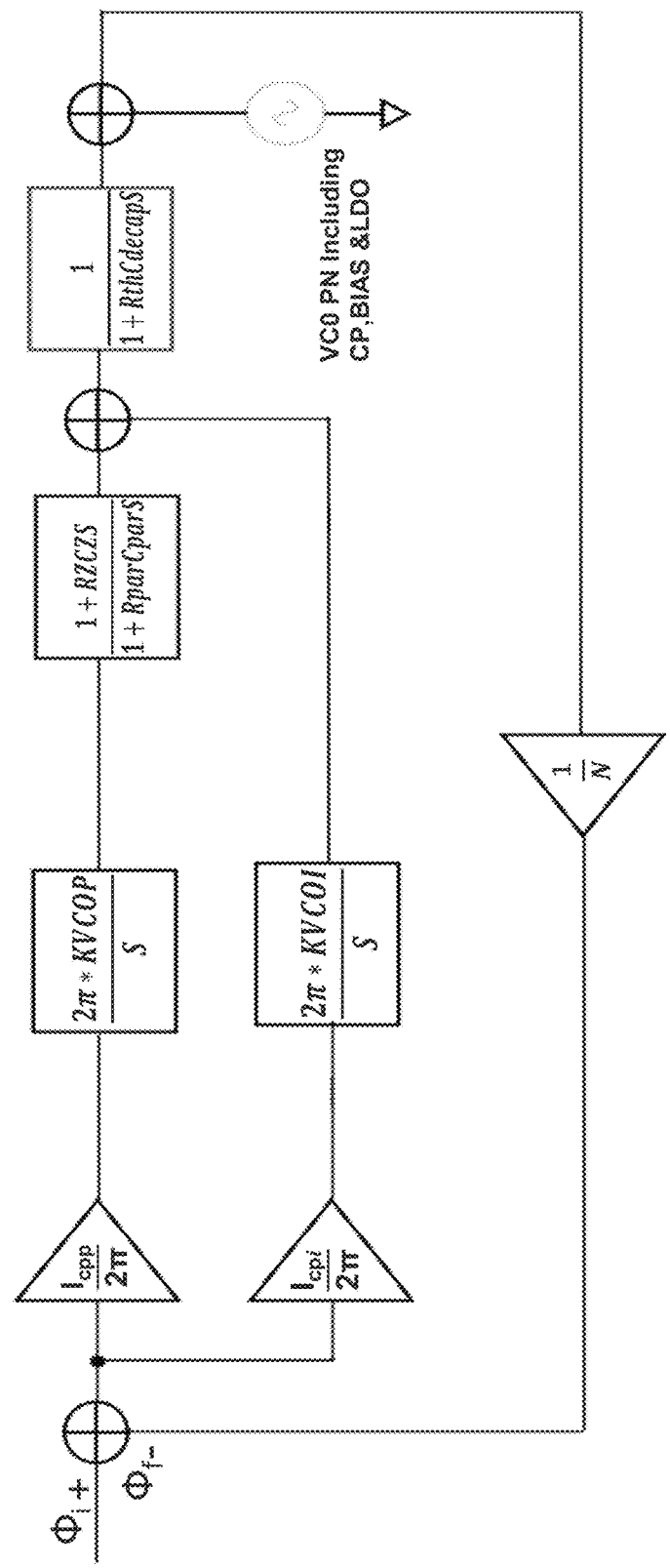
FIG. 10 is an example phase domain model consistent with embodiments of the present disclosure.

Referring now to FIG. 10, an example phase domain model 1000 consistent with embodiments of the present disclosure is provided. This particular example shows the effect of RJ due to device noise (e.g., thermal, flicker, etc.). The RJ in the ring VCO based PLL may be primarily dominated by the phase noise produced by the ring VCO itself due to the limitation of the bandwidth of the PLL loop (UGB). In some embodiments, due to the pole zero compensation techniques, the tradeoff between the better stability and higher bandwidth (UGB) may be reduced. Because of the higher UGB of the PLL loop, the RJ produced due to the ring VCO has been greatly suppressed as the transfer function from the ring VCO to the PLL output is high-pass in nature. A higher UGB tends to improve suppression of phase noise from the ring VCO.

Figure 11:
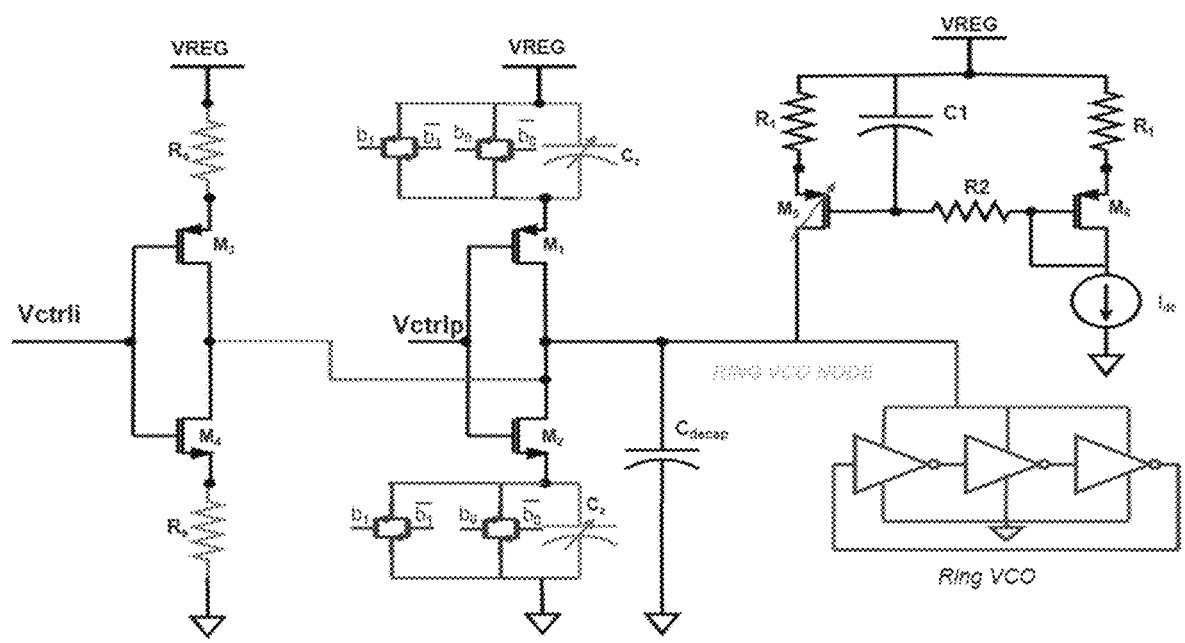
FIG. 11 is an example circuit according to an embodiment of the present disclosure.

Referring now to FIG. 11, an example circuit 1100 according to an embodiment of the present disclosure is provided. In this example, the Rs and Rz added in the control path of the PLL ring VCO may be kept as passive resistor components. Alternatively, any possible realization of resistors using either metal-oxide semiconductor ("MOS") switches or any other circuit technique is also within the scope of the present disclosure. In this particular example, b0 and b1 are programmable bits to control the transmission gate which may be replaced for the proportional degeneration resistor (Rz).

Referring now to FIG. 12, an exemplary flowchart 1200 according to embodiments of the present disclosure is provided. In one or more embodiments of the present disclosure a method including a ring voltage-controlled oscillator based phase locked loop is provided. The method may include providing 1202 an integral path including a plurality of resistors and a plurality of transistors configured to correct low frequency variations and a proportional path in electrical communication with the integral path. The proportional path may include a plurality of transistors and a source degeneration circuit. The method may further include electrically connecting 1204 a decoupling capacitor located at a ring voltage-controlled oscillator node with the proportional path, wherein the source degeneration circuit operates to cancel any effect from the ring voltage-controlled oscillator node. Numerous other operations are also within scope of the present disclosure as described above.

Embodiments of the present disclosure provide numerous advantages over existing approaches. Based on the working principle of the proposed architecture the looking in impedance at the ring VCO node has been decreased to a significantly lower value with respect to the desired supply noise frequency (e.g., 100 M-300 M). As a result, the perturbations due to supply noise as well as device noise may be drastically reduced which results in lowering jitter at the PLL output clock without affecting the PLL loop stability. Because of the source degeneration resistor added into the integral path of V2I block, the voltage to frequency conversion (change in frequency with respect to change in VCTRLI voltage) plot becomes more linear due to less dependency on transistor parameters. Because of the compensation technique, the design has the flexibility to increase the loop bandwidth (UGB), which suppresses the phase noise of the ring VCO to the overall PLL output leading to improvement of overall RJ loop performance as the ring VCO phase noise is the major contributor to the overall PLL phase noise.

It will be apparent to those skilled in the art that various modifications and variations can be made in the embodiments of the present disclosure without departing from the spirit or scope of the invention. Thus, it is intended that embodiments of the present disclosure cover the modifications and variations of this invention provided they come within the scope of the appended claims and their equivalents.

What is claimed is:

1. A ring voltage-controlled oscillator based phase locked loop circuit comprising:
   an integral path including a plurality of resistors and a plurality of transistors configured to correct low frequency variations;
   a proportional path in electrical communication with the integral path, the proportional path including a plurality of transistors and a source degeneration circuit, wherein the source degeneration circuit includes a programmable resistor; and
   a decoupling capacitor located at a ring voltage-controlled oscillator node in electrical communication with the proportional path, wherein the source degeneration circuit operates to cancel any effect from the ring voltage-controlled oscillator node.

2. The ring voltage-controlled oscillator based phase locked loop circuit of claim 1, wherein the proportional path further includes a second source degeneration circuit.

3. The ring voltage-controlled oscillator based phase locked loop circuit of claim 1, further comprising:
   first charge pump circuitry associated with the integral path.

4. The ring voltage-controlled oscillator based phase locked loop circuit of claim 1, further comprising:
   second charge pump circuitry associated with the proportional path.

5. The ring voltage-controlled oscillator based phase locked loop circuit of claim 1, wherein the source degeneration circuit includes a MOSFET.

6. The ring voltage-controlled oscillator based phase locked loop circuit claim 1, wherein the source degeneration circuit includes a capacitor.

7. A ring voltage-controlled oscillator based phase locked loop method comprising:
   providing an integral path including a plurality of resistors and a plurality of transistors configured to correct low frequency variations and a proportional path in electrical communication with the integral path, the proportional path including a plurality of transistors and a source degeneration circuit, wherein the source degeneration circuit includes a programmable resistor; and
   electrically connecting a decoupling capacitor located at a ring voltage-controlled oscillator node with the proportional path, wherein the source degeneration circuit operates to cancel any effect from the ring voltage-controlled oscillator node.

8. The ring voltage-controlled oscillator based phase locked loop method of claim 7, wherein the proportional path further includes a second source degeneration circuit.

9. The ring voltage-controlled oscillator based phase locked loop method of claim 7, further comprising:
   first charge pump circuitry associated with the integral path.

10. The ring voltage-controlled oscillator based phase locked loop method of claim 7, further comprising:
    second charge pump circuitry associated with the proportional path.

11. The ring voltage-controlled oscillator based phase locked loop method of claim 7, wherein the source degeneration circuit includes a MOSFET.

12. The ring voltage-controlled oscillator based phase locked loop method of claim 7, wherein the source degeneration circuit includes a capacitor.

13. A ring voltage-controlled oscillator based phase locked loop circuit comprising:
    an integral path including a first resistor directly connected with a first transistor and a second resistor directly connected with a second transistor;
    a proportional path in electrical communication with the integral path, the proportional path including a first source degeneration circuit directly connected with a first transistor and a second source degeneration circuit directly connected with a second transistor; and
    a decoupling capacitor located at a ring voltage-controlled oscillator node in electrical communication with the proportional path, wherein the source degeneration circuit operates to cancel any effect from the ring voltage-controlled oscillator node.

14. The ring voltage-controlled oscillator based phase locked loop circuit of claim 13, further comprising:
    first charge pump circuitry associated with the integral path.

15. The ring voltage-controlled oscillator based phase locked loop circuit of claim 13, further comprising:
    second charge pump circuitry associated with the proportional path.

16. The ring voltage-controlled oscillator based phase locked loop circuit of claim 13, wherein the source degeneration circuit includes a programmable resistor.

17. The ring voltage-controlled oscillator based phase locked loop circuit of claim 13, wherein the source degeneration circuit includes a MOSFET.

18. The ring voltage-controlled oscillator based phase locked loop circuit of claim 13, wherein the source degeneration circuit includes a capacitor.

* * * * *